(12) United States Patent
Kanaya (10) Patent No.: US 10,553,666 B2
(45) Date of Patent: Feb. 4, 2020

(54) DISPLAY DEVICE

(71) Applicant: Japan Display Inc., Minato-ku (JP)

(72) Inventor: Heisuke Kanaya, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/940,086

(22) Filed: Mar. 29, 2018

(65) Prior Publication Data
US 2018/0294328 A1 Oct. 11, 2018

(30) Foreign Application Priority Data
Apr. 5, 2017 (JP) ................. 2017-075519

(51) Int. Cl.
| | |
|---|---|
| G09G 3/3233 | (2016.01) |
| H01L 27/32 | (2006.01) |
| H01L 51/00 | (2006.01) |
| H01L 51/52 | (2006.01) |
| G09G 3/00 | (2006.01) |

(52) U.S. Cl.
CPC ......... H01L 27/3276 (2013.01); G09G 3/006 (2013.01); G09G 3/3233 (2013.01); H01L 51/0097 (2013.01); H01L 51/5253 (2013.01); H01L 2251/5338 (2013.01); H01L 2251/5392 (2013.01)

(58) Field of Classification Search
CPC ................ H01L 2251/5338; H01L 51/0097
USPC ..................................... 345/76–81
See application file for complete search history.

(56) References Cited

U.S. PATENT DOCUMENTS

| | | | | |
|---|---|---|---|---|
| 2004/0041753 A1* | 3/2004 | Nakanishi | ............ | G09G 3/3233 345/76 |
| 2014/0306941 A1* | 10/2014 | Kim | ....................... | G06F 1/1652 345/204 |
| 2018/0005568 A1* | 1/2018 | Kim | ....................... | G09G 3/3208 |
| 2018/0011576 A1* | 1/2018 | Ryu | ....................... | G06F 1/1652 |

FOREIGN PATENT DOCUMENTS

JP 2011-209405 10/2011

* cited by examiner

*Primary Examiner* — Roy P Rabindranath
(74) *Attorney, Agent, or Firm* — Oblon, McClelland, Maier & Neustadt, L.L.P.

(57) ABSTRACT

There is provided a display device including a pixel array portion including a plurality of pixels disposed in a matrix, a bending portion disposed at least outside the pixel array portion and to be bent, a peripheral circuit connected to the pixel array portion via the bending portion, the peripheral circuit for generating a signal to be supplied to the pixels, and a sealing film disposed avoiding the bending portion, the sealing film for preventing invasion of water particles into the pixel array portion and the peripheral circuit.

5 Claims, 6 Drawing Sheets

DISPLAY DEVICE

CROSS-REFERENCE TO RELATED APPLICATION

The present application claims priority from the Japanese Application JP2017-75519 filed on Apr. 5, 2017, the content of which is hereby incorporated by reference into this application.

BACKGROUND OF THE INVENTION

1. Field of the Invention

The present invention relates to display devices.

2. Description of the Related Art

Flat panel displays, such as organic electro-luminescent (EL) display devices, have a display panel where a thin film transistor (TFT) and an organic light emitting diode (OLED) are formed on a substrate. Conventionally, the base of a display panel is made using a glass substrate. Recently, a resin film or the like, such as polyimide films, is used for the base to develop flexible displays having a bendable display panel.

A flexible display is made for a use with an intention of reducing the area of the frame. Specifically, an area where an integrated circuit (IC) and a flexible printed circuit are mounted and that is located outside the image display area of the display panel is bent toward the rear surface side of the display area, whereby the area of the frame is reduced.

Japanese Patent Laid-open Publication No. 2011-209405 describes that a pixel array portion is disposed on the main body of the substrate and a peripheral circuit is disposed on the end portion of the substrate, the end portion disposed on the rear surface side of the display area as a result of the display device being bent along at least one of the peripheral sides of the pixel array portion.

SUMMARY OF THE INVENTION

The display quality of a display device is deteriorated if water should invade inside the display device. To avoid such water invasion, the display device is covered by a sealing film. Unfortunately, for a display device that can bend such that its peripheral circuit is disposed on the rear surface of its display array portion, as described in Japanese Patent Laid-open Publication No. 2011-209405, formation of a sealing film on the bending area makes it less easy to bend the area. If the area is forcibly bent, a wire underlying the sealing film can be disconnected or short-circuited.

The present invention has been conceived in view of the above, and it is an object of the present invention is to provide a display device whose frame can be made smaller as a result of its peripheral circuit disposed on the rear surface of the pixel array portion and whose wire is unlikely disconnected and/or short-circuited when bending the device.

According to one aspect of the present invention, there is provided a display device including a pixel array portion including a plurality of pixels disposed in a matrix, a bending portion disposed at least outside the pixel array portion and to be bent, a peripheral circuit connected to the pixel array portion via the bending portion, the peripheral circuit for generating a signal to be supplied to the pixels, and a sealing film disposed avoiding the bending portion, the sealing film for preventing invasion of water particles into the pixel array portion and the peripheral circuit.

In the above-mentioned aspects of the invention, the peripheral circuit includes a scan signal generation circuit that generates a scan signal for selection of timing at which to supply the signal to the pixels.

In the above-mentioned aspects of the invention, each of the pixels disposed in a matrix includes a plurality of sub-pixels that emit light beams in respective different colors, and the peripheral circuit includes a signal selection circuit that selects a sub-pixel to which a current is supplied from among the sub-pixels included in each pixel.

In the above-mentioned aspects of the invention, the peripheral circuit includes an inspection circuit that inspects an operation of the pixel array portion.

In the above-mentioned aspects of the invention, the display device further includes a protection film that protects the sealing film. The protection film is disposed so as to cover the pixel array portion, the bending portion, and the peripheral circuit area.

DETAILED DESCRIPTION OF THE INVENTION

The following describes embodiments of the present invention with reference to the drawings. The respective widths, thicknesses, shapes, and so forth of respective members may be illustrated more schematically in the drawings compared with actual widths, thicknesses, shapes, and so forth for clarification of the description. These, however, are mere examples, and should not limit interpretation of the present invention in any way. Any elements similar to those described earlier referring to drawings referred to earlier are given the same reference numerals in the specification and drawings and may not be described in detail again.

Figure 1:
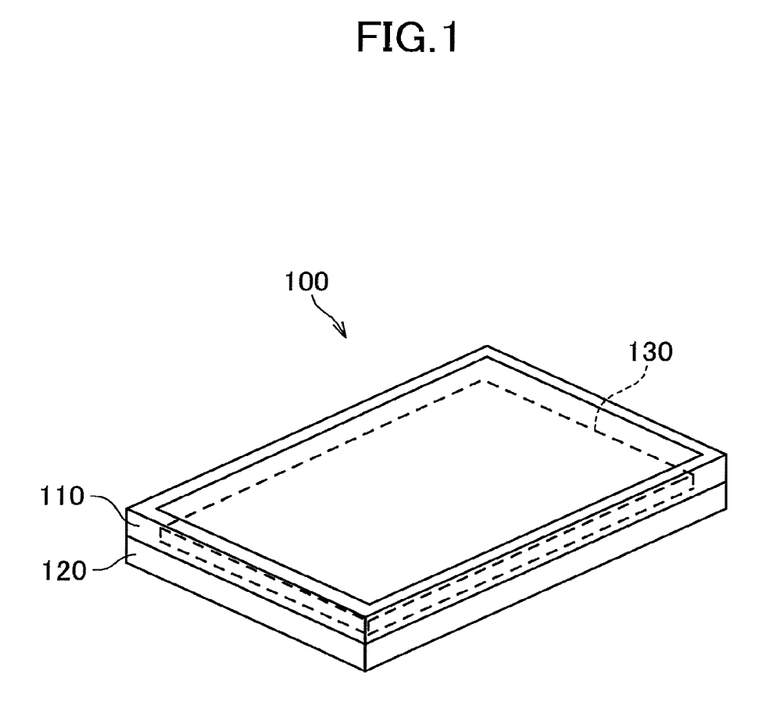
FIG. 1 schematically illustrates a display device according to an embodiment of the present invention.

FIG. 1 schematically illustrates a display device 100 according to an embodiment of the present invention. As illustrated, the display device 100 includes an upper frame 110, a lower frame 120, and a display panel 130 fixedly held between the upper frame 110 and the lower frame 120.

Figure 2:
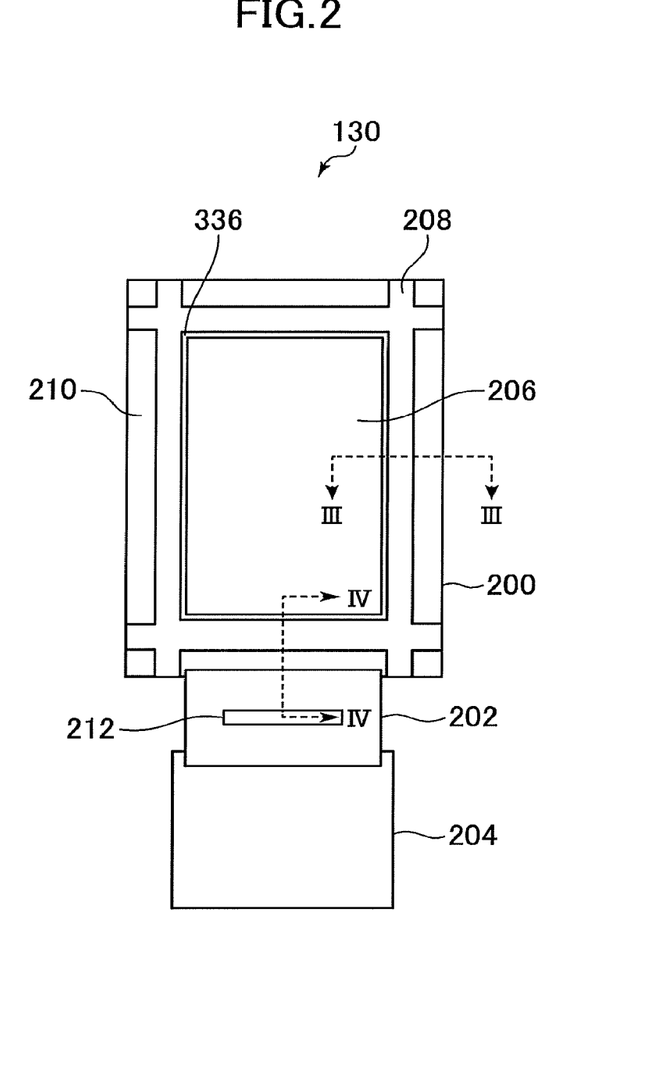
FIG. 2 is a diagram to explain an outline of a display panel.

FIG. 2 illustrates a schematic structure of the display panel 130 illustrated in FIG. 1. As illustrated in FIG. 2, the display panel 130 includes an insulating substrate 200, a first wire substrate 202, and a second wire substrate 204.

Each of the insulating substrate 200, the first wire substrate 202, and the second wire substrate 204 is a resin substrate or film and made of polyimide, for example. The insulating substrate 200 includes a pixel array portion 206, a bending portion 208, and a peripheral circuit 210. The insulating substrate 200 additionally includes a negative electrode contact portion 336 to be described later between the pixel array portion 206 and the bending portion 208.

The pixel array portion 206 has pixels disposed in a matrix thereon. Specifically, the pixel array portion 206 includes pixels disposed in a matrix, each pixel including an organic electroluminescent (EL) element 516 that emits light (see FIG. 6). Each of the pixels in a matrix includes a plurality of sub-pixels 500 that emit light beams in different colors.

The bending portion 208 is disposed at least outside the pixel array portion 206 and to be bent. Specifically, as illustrated in FIG. 2, for example, the bending portion 208 is provided above, below, to the left, and to the right of the pixel array portion 206, respectively. The bending portion 208 is to be bent toward the rear surface side of the pixel array portion 206 on at least one of the left and right sides of the pixel array portion 206. The bending portion 208 includes a first wire layer 310 for electrical connection between the peripheral circuit 210 and the pixel array portion 206 (see FIG. 3).

The peripheral circuit 210 is connected to the pixel array portion 206 via the bending portion 208 and generates a signal to be supplied to the plurality of pixels. Specifically, the peripheral circuit 210 is connected to the pixel array portion 206 via the bending portion 208. The peripheral circuit 210 is disposed on the rear surface of the pixel array portion 206 as a result of the bending portion 208 being bent.

The peripheral circuit 210 is an electronic circuit including a plurality of transistors 306 and generates a signal to drive the pixels disposed in the pixel array portion 206. Specifically, for example, the peripheral circuit 210 is a scan signal generation circuit that generates a signal to be supplied to a gate signal line 501 (see FIG. 6). A signal generated by the peripheral circuit 210 is supplied via a connection wire disposed in the bending portion 208 to the pixel array portion 206. Alternatively, the peripheral circuit 210 may be a circuit that generates a signal to be supplied to a reset signal line 506 or a light emission control signal line 508 to be described later.

Still alternatively, the peripheral circuit 210 may be a signal selection circuit that selects a sub-pixel 500 to which a current is supplied from among the sub-pixels 500 included in each pixel. Specifically, a case will be described below in which each pixel includes a red sub-pixel that emits red light, a green sub-pixel that emits green light, and a blue sub-pixel that emits blue light. In this case, for example, the peripheral circuit 210 may be a circuit that generates a signal for selection as to whether to supply a current to a red sub-pixel, a green sub-pixel, or a blue sub-pixel.

Furthermore, the peripheral circuit 210 may be an inspection circuit that inspects the operation of the pixel array portion 206. Specifically, an inspection circuit is a circuit for use in the process of manufacturing the display panel 130 and may generate an inspection signal to inspect whether the respective pixels in the pixel array portion 206 emit light. An inspection signal may be supplied to, for example, the insulating substrate 200 yet to be connected to the first wire substrate 202 to have all sub-pixels 500 to light with predetermined brightness.

The first wire substrate 202 has a drive semiconductor 212 thereon and is connected to the second wire substrate 204 and the insulating substrate 200. The drive semiconductor 212 generates a signal and power to be supplied to the peripheral circuit 210 and the pixel array portion 206, based on the power and a signal supplied from the second wire substrate 204.

The second wire substrate 204 has a connection terminal and a circuit component thereon and is connected to the first wire substrate 202. The connection terminal is, for example, a connector for external connection and connected to an external device that supplies power and a signal to the display panel 130. The connection terminal supplies the power and the signal to an electronic circuit (not illustrated) composed of the circuit component. The electronic circuit generates power and a signal and supplies to the first wire substrate 202.

The first wire substrate 202 and the second wire substrate 204 can be disposed on the rear surface of the pixel array portion 206 as the bending portion 208 illustrated below the pixel array portion 206 in the drawing is bent. In the case where the bending portions 208 provided above, below, to the left of, and to the right of the pixel array portion 206 can be all bent, the insulating substrate 200 may have a structure whose four corners are cut off.

Figure 3:
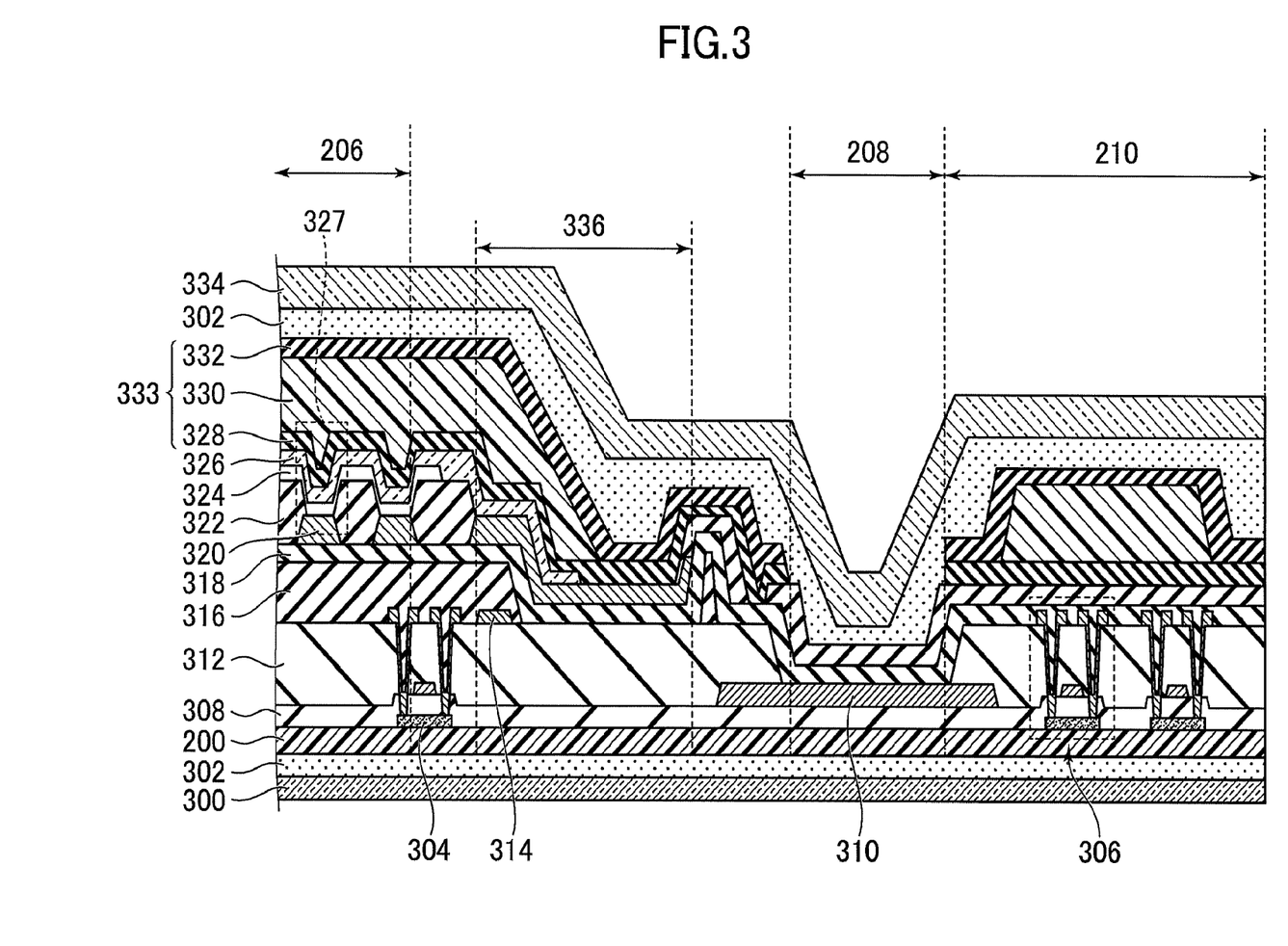
FIG. 3 illustrates one example of a schematic cross-section along the line in FIG. 2.

The following describes the cross-sectional structure of a right end portion of the pixel array portion 206 illustrated in FIG. 2. FIG. 3 is a cross-sectional view along the line in FIG. 2.

As illustrated in FIG. 3, the display panel 130 includes a rear protection film 300, an adhesive layer 302, the insulating substrate 200, a semiconductor layer 304, a gate insulating film 308, the first wire layer 310, a first inorganic insulating film 312, a second wire layer 314, an organic planarization film 316, a second inorganic insulating film 318, a lower electrode 320, an organic bank 322, an organic EL film 324, an upper electrode 326, a sealing film 333, and a front protection film 334.

The rear protection film 300 protects the rear side of the insulating substrate 200. Specifically, the rear protection film 300 is made of polyethylene terephthalate or polypropylene and attached on the entire rear surface of the insulating substrate 200 including the bending portion 208 via the adhesive layer 302. The rear protection film 300 is formed thin enough so as not to make it less easy to bend the bending portion 208.

The insulating substrate 200 is a substrate or a film that makes the base of the display panel 130. Specifically, the insulating substrate 200 is a substrate or a film made of flexible material, such as polyimide or polyethylene terephthalate. The front surface of the insulating substrate 200 may be covered by an inorganic film (not illustrated) formed by stacking a nitride film and an oxide film.

The semiconductor layer 304 is disposed on the insulating substrate 200. Specifically, the semiconductor layer 304 is disposed on the pixel array portion 206 and the peripheral circuit 210 where the transistors 306 are formed. In the case where an inorganic film is disposed on the front surface of the insulating substrate 200, the semiconductor layer 304 is formed on the inorganic film.

The channel region, the source region, and the drain region of each of the transistors 306 in the pixel circuit and the peripheral circuit 210 are formed using the semiconductor layer 304. The transistor 306 used in the peripheral circuit 210 is disposed in the area more outward than the bending portion 208. This disposition can reduce the area of the frame of the display panel 130. The pixel circuit will be described later.

The gate insulating film 308 is disposed on the semiconductor layer 304. Specifically, for example, the gate insulating film 308 is made of silicon oxide and disposed on the semiconductor layer 304 and the insulating substrate 200.

The first wire layer 310 is disposed on the gate insulating film 308. Specifically, the first wire layer 310 is disposed above the semiconductor layer 304 is disposed and in the bending portion 208. The first wire layer 310 in the bending portion 208 supplies a signal generated by the peripheral circuit 210 or power supplied from the first wire substrate 202 to the pixel array portion 206. The first wire layer 310 is used as a gate electrode of the transistor 306 in the pixel circuit and the peripheral circuit 210.

The first inorganic insulating film 312 is disposed on the first wire layer 310. Specifically, the first inorganic insulating film 312 is formed by stacking a nitride film and an oxide film and disposed on the first wire layer 310 and the gate insulating film 308.

The second wire layer 314 is disposed on the first inorganic insulating film 312. Specifically, the second wire layer 314 is formed by stacking molybdenum (Mo), aluminum (Al), and Mo in this order and disposed on the first inorganic insulating film 312. The second wire layer 314 electrically connects the semiconductor layer 304 and the lower electrode 320 through a contact hole formed in the first inorganic insulating film 312.

The organic planarization film 316 is disposed on the second wire layer 314. Specifically, the organic planarization film 316 is made of, for example, polyimide or acrylic resin and disposed on the second wire layer 314 and the first inorganic insulating film 312. The organic planarization film 316 serves to flatten the asperities of the layer underlying the organic planarization film 316.

The second inorganic insulating film 318 is disposed on the organic planarization film 316. Specifically, the second inorganic insulating film 318 is made of dampproof insulating material and disposed on the organic planarization film 316. For example, the second inorganic insulating film 318 is formed by stacking a nitride film and an oxide film. The second inorganic insulating film 318 can prevent invasion of water through the organic planarization film 316 into the organic EL film 324.

The lower electrode 320 is disposed on the second inorganic insulating film 318. Specifically, the lower electrode 320 is made of indium tin oxide (ITO) and disposed on the second inorganic insulating film 318. The lower electrode 320 is electrically connected to the source or drain electrode of the transistors 306 through a contact hole (not illustrated) that penetrates the second inorganic insulating film 318 and the organic planarization film 316. The lower electrode 320 corresponds to the anode terminal of an organic EL element 516 in each pixel. A reflection film made of material, such as magnesium silver (MgAg), that reflects light may be formed between the lower electrode 320 and the second inorganic insulating film 318.

The organic bank 322 is disposed on the lower electrode 320. Specifically, the organic bank 322 is disposed on the lower electrode 320 along the boundary between the sub-pixels 500. The organic bank 322 has an opening at a position corresponding to the light emitting surface of the organic EL film 324 such that the upper surface of the lower electrode 320 is partially exposed in the opening with the area around the exposed portion covered by the organic bank 322.

The organic EL film 324 is disposed on the organic bank 322. Specifically, the organic EL film 324 is disposed in contact with the lower electrode 320 at the bottom of the opening formed in the organic bank 322. The organic EL film 324 includes a hole injection layer, a hole transport layer, a light emitting layer, an electron transport layer, an electron injection layer, and the like. The light emitting layer is made of materials that emit red, green, and blue respective light beams for every sub-pixel 500.

The upper electrode 326 is disposed on the organic EL film 324. Specifically, the upper electrode 326 is disposed on the organic EL film 324 so as to spread from the pixel array portion 206 to the negative electrode contact portion 336. The negative electrode contact portion 336 is an area between the pixel array portion 206 and the bending portion 208. In the negative electrode contact portion 336, the upper electrode 326 is electrically connected to the lower electrode 320.

The upper electrode 326 receives power from the peripheral circuit 210 or the first wire substrate 202 via the lower electrode 320 disposed in the negative electrode contact portion 336. With the above, the upper electrode 326 functions as a cathode terminal of the organic EL element 516 in each sub-pixel 500. The upper electrode 326 is made of material that passes through the light emitted from the organic EL film 324. For example, the upper electrode 326 is made of transparent conductive material, such as indium zinc oxide or ITO. In the area corresponding to the opening formed in the organic bank, the lower electrode 320, the organic EL film 324, and the upper electrode 326 together constitute a light emitting element 327. The light emitting element 327 corresponds to the organic EL element 516 in FIG. 6.

The sealing film 333 is disposed avoiding the bending portion 208. The sealing film 333 prevents invasion of water particles into the pixel array portion 206 and the peripheral circuit 210. The sealing film 333 is formed by stacking a first inorganic sealing film 328, an organic sealing film 330, and a second inorganic sealing film 332.

Specifically, the first inorganic sealing film 328 is disposed so as to cover the upper electrode 326 in the pixel array portion 206, and so as to cover the upper electrode 326, the lower electrode 320, and the organic bank 322 in the area between the pixel array portion 206 and the bending portion 208. The first inorganic sealing film 328 is disposed on the upper side of the transistor 306 in the peripheral circuit 210.

The organic sealing film 330 is disposed so as to cover the first inorganic sealing film 328 in the pixel array portion 206. The organic sealing film 330 is disposed on the upper side of the first inorganic sealing film 328 in the area between the pixel array portion 206 and the bending portion 208. Additionally, the organic sealing film 330 is disposed on a part of the first inorganic sealing film 328 in the peripheral circuit 210.

The second inorganic sealing film 332 is disposed so as to cover the organic sealing film 330 in the pixel array portion 206. The second inorganic sealing film 332 is disposed so as to cover the organic sealing film 330 and the first inorganic sealing film 328 in the area between the pixel array portion 206 and the bending portion 208. The second inorganic sealing film 332 is disposed so as to cover the organic sealing film 330 and the first inorganic sealing film 328 in the peripheral circuit 210.

The first inorganic sealing film 328 and the second inorganic sealing film 332 are made of inorganic insulating material that is a compound of silicon (Si), oxygen (O), and nitrogen (N) or carbon (C). Specifically, for example, each of the first inorganic sealing film 328 and the second inorganic sealing film 332 is a silicon oxide film (SiO), a silicon nitride film (SiN), a silicon carbide film (SiC), a silicon oxynitride film (SiON), a silicon carbonitride film (SiCN), or a silicon oxycarbonitride film (SiOCN). The organic sealing film 330 is made of organic material including acryl, epoxy, siloxane-based resin.

The front protection film 334 is attached on the upper side of the sealing film 333 via the adhesive layer 302. Specifically, the front protection film 334 is disposed so as to cover the pixel array portion 206, the bending portion 208, and the peripheral circuit 210. The front protection film 334 is made of the same material as that of the rear protection film 300. The front protection film 334 is formed so thin so as not to make it less easy to bend the bending portion 208. The front protection film 334 is disposed such that the respective end portions thereof are aligned with the respective end portions of the insulating substrate 200 in the right and left respective frame areas of the display panel 130.

In some positions in the area more inward than the bending portion 208 and in the peripheral circuit 210, the first inorganic sealing film 328 is in contact with the second inorganic sealing film 332. This structure holds the organic sealing film 330 not protruding from the end portion of the sealing film 333, and thus can prevent invasion of water from the end portion of the organic sealing film 330.

The sealing film 333 is disposed avoiding the bending portion 208 so as not to impede easy bending of the bending portion 208. This makes it unlikely to cause disconnection and/or short-circuiting of the first wire layer 310 disposed in the bending portion 208. The negative electrode contact portion 336 is disposed in a part of the frame-like area between the pixel array portion 206 and the bending portion 208 illustrated in FIG. 2.

Figure 4:
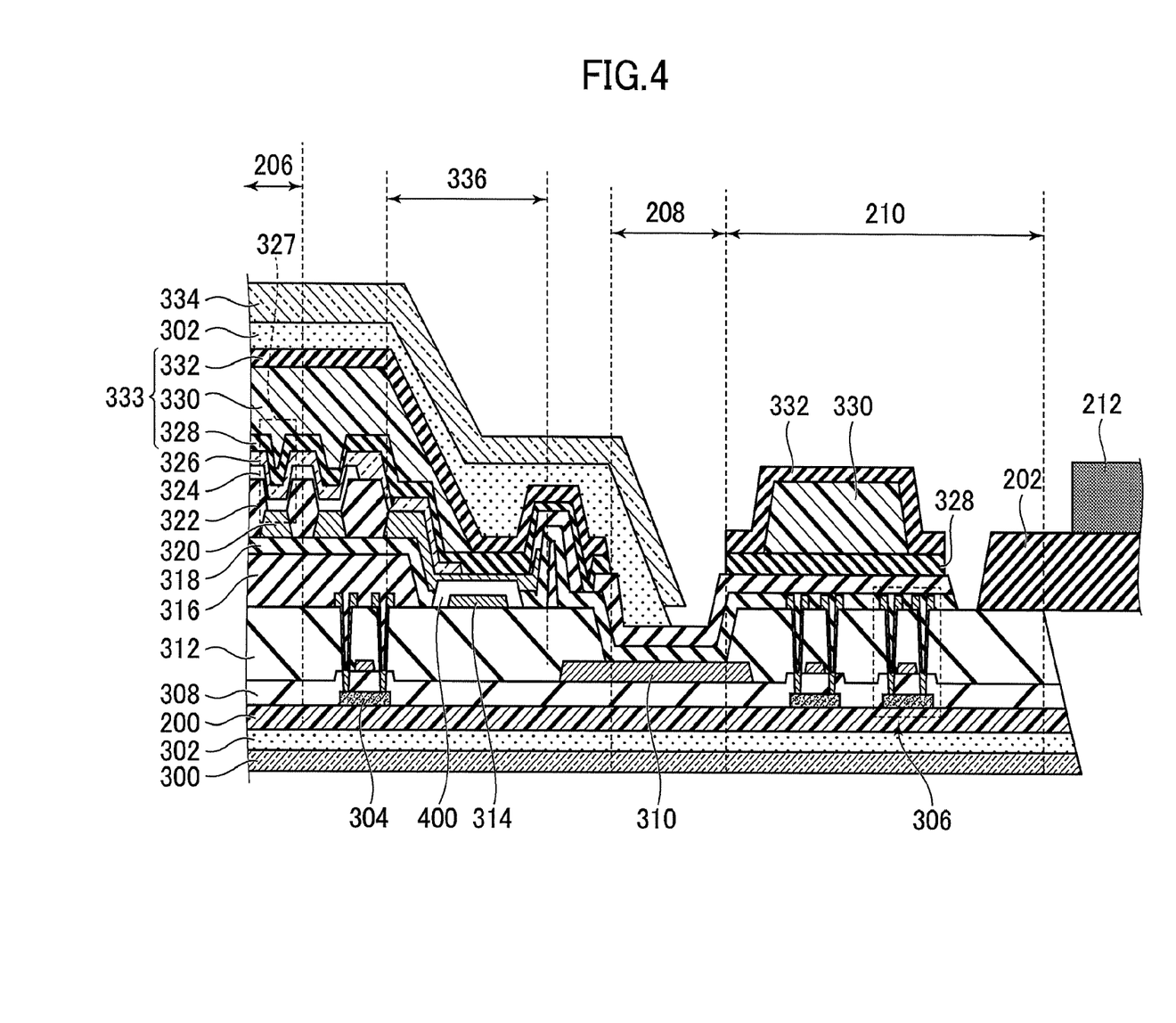
FIG. 4 illustrates one example of a schematic cross-section along the line IV-IV in FIG. 2.

The following describes the cross-sectional structure of a lower end portion of the pixel array portion 206 illustrated in FIG. 2. FIG. 4 is a cross-sectional view along the line IV-IV in FIG. 2.

Similar to the structure in FIG. 2, the rear protection film 300 is attached on the entire rear surface of the insulating substrate 200 including the bending portion 208 via the adhesive layer 302. The insulating substrate 200 may be covered by an inorganic film, similar to the structure illustrated in FIG. 2. The semiconductor layer 304 is disposed in the pixel array portion 206 and the peripheral circuit 210 where the transistors 306 are formed. The gate insulating film 308 is disposed so as to cover the semiconductor layer 304 and the insulating substrate 200.

The first wire layer 310 is disposed above the semiconductor layer 304d and in the bending portion 208. Similar to the structure illustrated in FIG. 2, the first wire layer 310 in the bending portion 208 supplies a signal generated by the peripheral circuit 210 and power or the like supplied from a drive semiconductor 212 to the pixel array portion 206. The structures of the first inorganic insulating film 312, the second wire layer 314, the organic planarization film 316, and the second inorganic insulating film 318 are similar to those illustrated in FIG. 3, and thus not described here.

In an end portion of the peripheral circuit 210, the first wire substrate 202 is disposed on the first inorganic insulating film 312 of the first wire substrate 202. Specifically, the first wire substrate 202 is pressed onto the first inorganic insulating film 312 to be attached thereon via an anisotropic conductive film (ACF). In a part of the area where the first wire substrate 202 is attached on the first inorganic insulating film 312, an opening (not illustrated) is formed in the first inorganic insulating film 312. In the opening, a terminal (not illustrated) provided to the first wire substrate 202 is electrically connected to the first wire layer 310 via the ACF.

The drive semiconductor 212 is disposed on the first wire substrate 202. Specifically, for example, a bump (not illustrated) of the drive semiconductor 212 is electrically connected to a wire on the first wire substrate 202. The drive semiconductor 212 is disposed on the rear surface of the pixel array portion 206 as a result of the bending portion 208 being bent. The drive semiconductor 212 may be disposed on the lower side of the first wire substrate 202 in the drawing.

A third inorganic insulating film 400 is disposed so as to cover the second wire layer 314 on the negative electrode contact portion 336. Specifically, the third inorganic insulating film 400 is made of the same material as that of the first inorganic insulating film 312 or that of the second inorganic insulating film 318 and disposed so as to cover the second wire layer 314 on the negative electrode contact portion 336.

The third inorganic insulating film 400 can prevent short-circuiting between the second wire layer 314 and the lower electrode 320. Note that, instead of the third inorganic insulating film 400, the second inorganic insulating film 318 may cover the second wire layer 314. The structures of the lower electrode 320, the organic bank 322, the organic EL film 324, the upper electrode 326, and the sealing film 333 are the same as those illustrated in FIG. 2 and not described here.

The front protection film 334 is attached on the sealing film 333 via the adhesive layer 302. Specifically, the protection film 334 is disposed so as to cover the pixel array portion 206, the negative electrode contact portion 336, and a part of the bending portion 208.

As described above, the sealing film 333 is disposed avoiding the bending portion 208 on the lower side of the pixel array portion 206 as well so as not to impede easy bending of the bending portion 208. This can make it unlikely to cause disconnection and short-circuiting of the first wire layer 310 in the bending portion 208. Additionally, as the adhesive layer 302 and the front protection film 334 are discontinuous in the bending portion 208, the process of bending the bending portion can be readily performed.

In the case where the peripheral circuit 210 is not disposed in the area more outward than the bending portion 208, the semiconductor layer 304, the first wire layer 310, the second wire layer 314, and the sealing film 333 disposed in the area more outward than the bending portion 208 are omissible.

Figure 5:
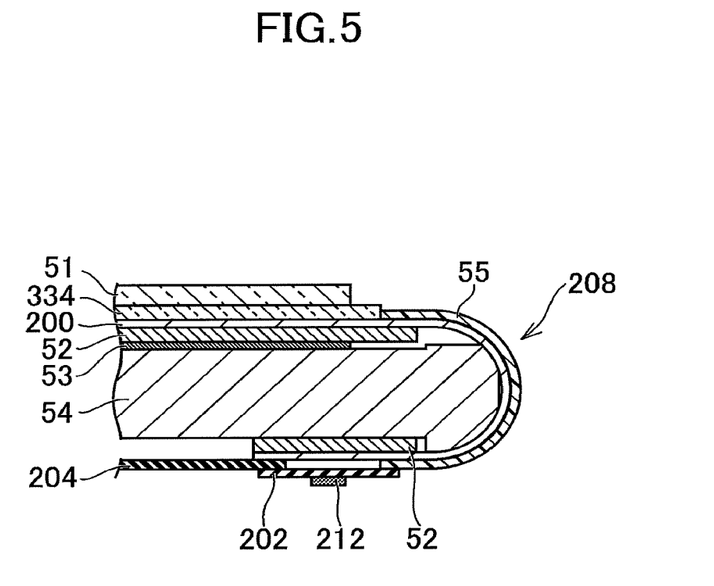
FIG. 5 illustrates one example of a schematic cross-section of a display device in a bent state.

FIG. 5 is a schematic cross-sectional view of the display panel 130 near the bending portion 208. As illustrated in FIG. 5, the display panel 130 includes the insulating substrate 200, the first wire substrate 202, the second wire substrate 204, the drive semiconductor 212, the front protection film 334, a polarizer plate 51, a first reinforcement film 52, a thermal diffusion sheet 53, a spacer 54, and a second reinforcement film 55. In FIG. 5, the structures of the rear protection film 300, the adhesive layer 302, the semiconductor layer 304, and each configuration between the adhesive layer 302 and the semiconductor layer 304 are not illustrated.

The insulating substrate 200 is bent in the bending portion 208. The second wire substrate 204 is disposed on the lower side of the spacer 54. The first wire substrate 202 is disposed so as to connect the insulating substrate 200 and the second wire substrate 204. The drive semiconductor 212 is disposed on the lower side, in the drawing, of the first wire substrate 202 as a result of the bending portion 208 being bent. Alternatively, the drive semiconductor 212 may be disposed on the upper side of the first wire substrate 202.

As described above, the front protection film 334 protects the display panel 130. The front protection film 334 is disposed only in a flat area of the display panel 130. This disposition facilitates the process of bending the bending portion 208.

The polarizer plate 51 reduces reflection of external light having entered the display panel 130. This improves visibility of the display panel 130.

The first reinforcement film 52 reinforces the display panel 130. The first reinforcement film 52 is disposed in a flat area of the display panel 130 in a bent state. Specifically, the first reinforcement film 52 is disposed on the rear surface of the pixel array portion 206 of the display panel 130.

The thermal diffusion sheet 53 diffuses the heat of the display panel 130. Specifically, the thermal diffusion sheet 53 diffuses the heat generated by the drive circuit around the display panel 130 into the entire display panel 130. The diffusion can prevent increase in temperature in only apart of the display panel 130.

The spacer 54 is disposed between portions on the front surface side and the rear surface side of the display panel 130 in a bent state. The spacer 54 keeps the interval between the portions on the front surface side and the rear surface side equal to or greater than a predetermined interval. This enables the bending portion 208 to retain its curvature within a tolerable range if pressure should be applied to the display panel 130 in its width direction.

The end portion of the spacer 54 is formed so as to constitute a curved surface in accordance with the curvature of the rear surface of the bending portion 208. The end portion of the spacer 54 abuts on the rear surface of the bending portion 208. This can keep the bending portion 208 in a constant shape if pressure should be applied to the front surface of the bending portion 208. The second reinforcement film 55 reinforces the display panel 130. The second reinforcement film 55 is disposed in the bending portion 208 of the display panel 130 in a bent state. The second reinforcement film 55 is made of material more readily bendable than that of the first reinforcement film 52 so as to have such a thickness that allows the second reinforcement film 55 to be bent more easily than the first reinforcement film 52.

The second reinforcement film 55 may not be attached on the bending portion 208. This structure increases the flexibility of the bending portion 208 and allows to curve the display panel 130 so as to have a smaller curvature radius. The smaller the curvature radius of the bending portion 208 is, the smaller the dimension in a plan view of the display panel 130 in a bent state is, and the thinner the display panel 130 in a bent state is.

The spacer 54 is omissible. Specifically, the spacer 54 may be omitted so that the bending portion 208 can bend at a more acute angle. This structure can make the display panel 130 thinner.

As described above, the first wire substrate 202 and the second wire substrate 204, or the portions farther from the pixel array portion 206 than the bending portion 208, can bend toward the rear surface side of the pixel array portion 206. Bending the first wire substrate 202 and the second wire substrate 204 as described above can reduce the dimension of the display device 100 in a plan view so that the display device 100 can have a smaller dimension. Moreover, the portion of the display panel 130 closer to the end portion of the display panel 130 than the bending portion 208 of the insulating substrate 200 is hidden behind the rear surface. This can increase the percentage of the pixel array portion 206 relative to the front surface of the display panel 130.

The drive semiconductor 212 or the like is mounted on the portion of the display panel 130 that is to bend toward the rear surface side of the display panel 130 so that the end portion of display panel 130 on the front display surface side is not used for mounting a component such as an integrated circuit (IC) or the like thereon. This can reduce the area of the frame. That is, the display device 100 can have a smaller frame.

Figure 6:
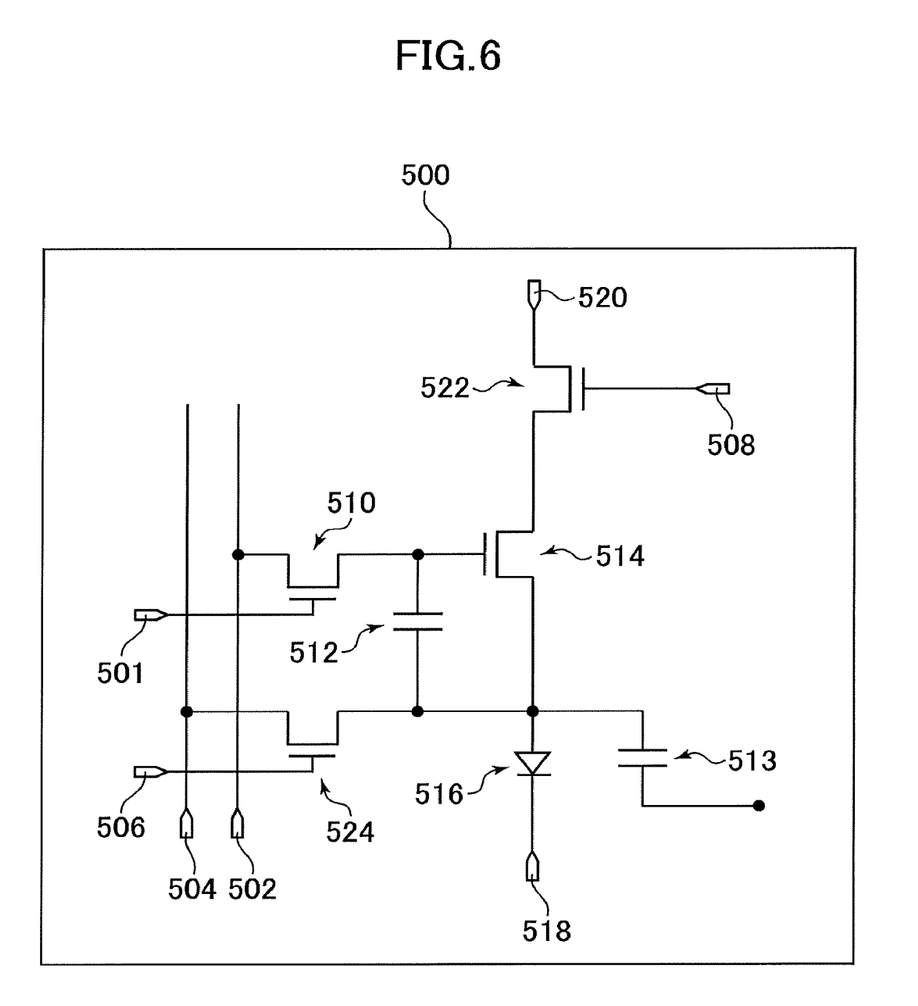
FIG. 6 illustrates a circuit formed in a sub-pixel.

The following describes a pixel circuit disposed in each of the sub-pixels 500 constituting the pixel array portion 206. FIG. 6 illustrates a circuit formed in the sub-pixel 500. As illustrated in FIG. 6, the sub-pixel 500 includes the gate signal line 501, a video signal line 502, a reset power supply line 504, the reset signal line 506, a light emission control signal line 508, a pixel selection transistor 510, a storage capacitor 512, an auxiliary capacitor 513, a drive transistor 514, an organic EL element 516, a cathode terminal 518, a power supply 520, a light emission control transistor 522, and a reset transistor 524.

The gate signal line 501 is connected to the gate terminal of the pixel selection transistor 510. Specifically, the gate signal line 501 electrically connects the peripheral circuit 210 and the gate terminal of the pixel selection transistor 510. The gate signal line 501 supplies a pixel selection signal obtained from the peripheral circuit 210 to the gate terminal of the pixel selection transistor 510.

The video signal line 502 is connected to either one of the source and drain terminals of the pixel selection transistor 510. Specifically, the video signal line 502 electrically connects the drive semiconductor 212 and one of the source and drain terminals of the pixel selection transistor 510. The video signal line 502 supplies a voltage in accordance with a video signal obtained from the peripheral circuit 212 to one of the source and drain terminals of the pixel selection transistor 510.

The reset power supply line 504 is connected to one of the source and drain terminals of the reset transistor 524. Specifically, the reset power supply line 504 electrically connects the drive semiconductor 212 and one of the source and drain terminals of the reset transistor 524. The reset power supply line 504 supplies a voltage in accordance with a reset signal obtained from the drive semiconductor 212 to one of the source and drain terminals of the reset transistor 524.

The reset signal line 506 is connected to the gate terminal of the reset transistor 524. Specifically, the reset signal line 506 electrically connects the drive semiconductor 212 and the gate terminal of the reset transistor 524. The reset power supply line 504 supplies a reset signal obtained from the drive semiconductor 212 to the gate terminal of the reset transistor 524.

The light emission control signal line 508 is connected to the gate terminal of the light emission control transistor 522. Specifically, the light emission control signal line 508 electrically connects the peripheral circuit 210 and the gate terminal of the light emission control transistor 522. The light emission control signal line 508 supplies a light emission control signal obtained from the peripheral circuit 210 to the gate terminal of the light emission control transistor 522.

The pixel selection transistor 510 controls a voltage input stored in the storage capacitor 512, based on a video signal. Specifically, the pixel selection transistor 510 has the source and drain terminal thereof electrically conducting to each other when a voltage received by the gate terminal thereof is in either one of the high and low states (hereinafter referred to as an on state). In accordance with the state of a gate signal received by the gate terminal, the pixel selection transistor 510 supplies the voltage in the video signal line 502 to the storage capacitor 512. With the above, the pixel selection transistor 510 controls the voltage input stored in the storage capacitor 512, based on a video signal.

The storage capacitor 512 stores the voltage supplied from the video signal line 502. Specifically, the storage capacitor 512 comes to have the same potential as the voltage in the video signal line 502 at timing with the pixel selection transistor 510 in an on state. Thereafter, in response to a gate signal, the source terminal and the drain terminal of the pixel selection transistor 510 are electrically disconnected from each other (hereinafter referred to as an off state). Thereafter, the storage capacitor 512 remains in a floating state until either the pixel selection transistor 510 or the reset transistor 524 comes to be in an on state, and thus stores the voltage supplied from the video signal line 502.

The drive transistor 514 is connected to the pixel selection transistor 510, the storage capacitor 512, the light emission control transistor 522, and the organic EL element 516. Specifically, the gate terminal of the drive transistor 514 is electrically connected to the source or drain terminal of the pixel selection transistor 510 and the storage capacitor 512. One of the source and drain terminals of the drive transistor 514 is electrically connected to the source or drain terminal of the light emission control transistor 522. The other one of the source and drain terminals of the drive transistor 514 is electrically connected to the storage capacitor 512, the auxiliary capacitor 513, the anode terminal of the organic EL element 516, and one of the source and drain terminals of the reset transistor 524.

The drive transistor 514 supplies a current to the organic EL element 516. Specifically, the drive transistor 514 supplies the current supplied from the power supply 520 to the organic EL element 516, the current in accordance with the voltage applied to the storage capacitor 512.

The organic EL element 516, having received the current, emits light. Specifically, the organic EL element 516 receives a current in accordance with the voltage held in the storage capacitor 512 from the drive transistor 514 and thereupon emits light. The organic EL element 516 includes the above mentioned lower electrode 320, organic EL film 324, and upper electrode 326.

The cathode terminal 518 is electrically connected to the organic EL element 516. Specifically, the cathode terminal 518 is electrically connected to the cathode terminal of the organic EL element 516. A voltage is applied between the cathode terminal 518 and the power source 520. The cathode terminal 518 supplies a current to the organic EL element 516. The cathode terminal 518 corresponds to the above described upper electrode 326.

The power supply 520 is connected to the light emission control transistor 522 and supplies a current to the organic EL element 516. Specifically, the power supply 520 is electrically connected to the source or drain terminal of the light emission control transistor 522. The power supply 520 is connected to the drive semiconductor 212 or the peripheral circuit 210 and receives a constant voltage. With the above, the power supply 520 supplies a current to the organic EL element 516 when the drive transistor 514 and the light emission control transistor 522 are in an on state.

The light emission control transistor 522 controls whether to stop the supply from the power supply 520 to the organic EL element 516. Specifically, one of the source and drain terminals of the light emission control transistor 522 is connected to the power supply 520, and the other is electrically connected to the source or drain terminal of the drive transistor 514. The gate terminal of the drive transistor 514 is electrically connected to the light emission control signal line 508.

According to a light emission control signal from the light emission control signal line 508, the light emission control transistor 522 is controlled so as to be put into either an on state or an off state. With the light emission control transistor 522 in an on state, the light emission control transistor 522 supplies the current from the power supply 520 to the organic EL element 516 via the drive transistor 514. With the light emission control transistor 522 in an off state, on the other hand, the light emission control transistor 522 stops the supply from the power supply 520 to the organic EL element 516.

The reset transistor 524 controls the timing at which to reset the voltage stored in the storage capacitor 512. Specifically, the gate terminal of the reset transistor 524 is connected to the reset signal line 506. One of the source and drain terminals of the reset transistor 524 is connected to the reset power supply line 504. The other one of the source and drain terminals of the reset transistor 524 is connected to the storage capacitor 512, the auxiliary capacitor 513, the anode terminal of the organic EL element 516, and one of the source and drain terminals of the drive transistor 514.

The reset transistor 524 controls such that the voltage stored in the storage capacitor 512 and the auxiliary capacitor 513 comes to be equal to the voltage at the initial state. Specifically, the reset transistor 524 is controlled so as to be put into either an on state or an off state by the reset signal from the reset signal line 506. With the reset transistor 524 in an on state, the storage capacitor 512 and the auxiliary capacitor 513 receive the voltage in the reset power supply line 504 that is equal to the voltage at the initial state. After the voltage in the storage capacitor 512 and the auxiliary capacitor 513 comes to be equal to the voltage at the initial state, the pixel selection transistor 510 comes to be in an on state, whereby the voltage held in the storage capacitor 512 and the auxiliary capacitor 513 is changed.

As described above, the current from the power supply 520 or the signal generated by the peripheral circuit 210 or the drive semiconductor 212 is supplied via the first wire layer 310 disposed in the bending portion 208 to the pixel circuit. With the above, the display panel 130 displays an image on the pixel array portion 206.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
a pixel array portion including a plurality of pixels disposed in a matrix;
a bending portion disposed at least outside the pixel array portion and to be bent;
a peripheral circuit connected to the pixel array portion via the bending portion,
the peripheral circuit for generating a signal to be supplied to the pixels; and
a sealing film disposed avoiding the bending portion, the sealing film for preventing invasion of water particles into the pixel array portion and the peripheral circuit, wherein the sealing film includes a first sealing region that covers the pixel array portion and a second sealing region that covers the peripheral circuit, and
the first sealing region and the second sealing region are separated from each other at the bending portion;
wherein the first sealing region includes a first inorganic insulation layer, a first organic layer on the first inorganic insulation layer, and a second inorganic insulation layer on the first organic layer,
the second sealing region includes a third inorganic insulation layer, a second organic layer on the third inorganic insulation layer, and a fourth inorganic insulation layer on the second organic layer,
a first contact region surrounds the first organic layer in which the first inorganic insulation layer is in contact with the second inorganic insulation layer, and a second contact region surrounds the second organic layer in which the third inorganic insulation layer is in contact with the fourth inorganic insulation layer.

2. The display device according to claim 1, wherein the peripheral circuit includes a scan signal generation circuit that generates a scan signal for selection of timing at which to supply the signal to the pixels.

3. The display device according to claim 1, wherein each of the pixels disposed in a matrix includes a plurality of sub-pixels that emit lights in respective different colors, and the peripheral circuit includes a signal selection circuit that selects a sub-pixel to which a current is supplied from among the sub-pixels included in each pixel.

4. The display device according to claim 1, wherein the peripheral circuit includes an inspection circuit that inspects an operation of the pixel array portion.

5. The display device according to claim 1, further comprising a protection film that protects the sealing film, wherein the protection film is disposed so as to cover the pixel array portion, the bending portion, and the peripheral circuit area.

* * * * *